United States Patent
Ruiz et al.

(10) Patent No.: US 10,601,335 B1
(45) Date of Patent: Mar. 24, 2020

(54) LOW INDUCTANCE POWER INVERTER

(71) Applicants: Javier Ruiz, Cupertino, CA (US); Paul M. White, Sunnyvale, CA (US)

(72) Inventors: Javier Ruiz, Cupertino, CA (US); Paul M. White, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 296 days.

(21) Appl. No.: 15/406,046

(22) Filed: Jan. 13, 2017

Related U.S. Application Data

(60) Provisional application No. 62/279,510, filed on Jan. 15, 2016.

(51) Int. Cl.
| | |
|---|---|
| *H05K 1/00* | (2006.01) |
| *H02M 7/00* | (2006.01) |
| *H05K 1/18* | (2006.01) |
| *H05K 1/02* | (2006.01) |
| *H05K 5/00* | (2006.01) |

(52) U.S. Cl.
CPC ............ *H02M 7/003* (2013.01); *H05K 1/028* (2013.01); *H05K 1/183* (2013.01); *H05K 5/0026* (2013.01); *H05K 2201/10015* (2013.01)

(58) Field of Classification Search
CPC ....... H02M 7/003; H05K 1/028; H05K 1/183; H05K 5/0026; H05K 2201/10015
See application file for complete search history.

(56) References Cited

U.S. PATENT DOCUMENTS

| | | | | |
|---|---|---|---|---|
| 8,315,035 | B2* | 11/2012 | Togashi | H01G 2/06 361/306.3 |
| 2011/0242725 | A1* | 10/2011 | Herrmann | H01G 2/04 361/306.2 |
| 2012/0306213 | A1* | 12/2012 | Hubbers | H03K 17/16 290/55 |
| 2017/0062132 | A1* | 3/2017 | Weissenborn | H01G 4/005 |

* cited by examiner

*Primary Examiner* — Pete T Lee
(74) *Attorney, Agent, or Firm* — Young, Basile Hanlon & MacFarlane, P.C.

(57) ABSTRACT

A power inverter circuit includes a capacitor and a power module. The capacitor includes a positive plate and a negative plate that are spaced apart along opposing sides of the capacitor and extend toward each other along a common side of the capacitor. The power module includes a positive connector and a negative connector that are connected to the positive plate and the negative plate, respectively, and are spaced apart and extend parallel across from each other.

27 Claims, 12 Drawing Sheets

LOW INDUCTANCE POWER INVERTER

CROSS-REFERENCE TO RELATED APPLICATION(S)

This application claims the benefit of U.S. Provisional Application No. 62/279,510, which was filed on Jan. 15, 2016.

TECHNICAL FIELD

This disclosure relates generally high power inverter systems and, more specifically, power inverter systems having a direct current (DC) capacitor and a power inverter module that are cooperatively configured to produce low inductance.

BACKGROUND

Power converters (e.g., converters, inverters, devices, systems, or circuits) are used in many electrical systems, such as uninterruptible power supplies to electric motors. In general, a power converter is an electronic device that converts electric energy from one form to another. A power inverter is a type of power converter that converts direct current (DC) to alternating current (AC) for use by an electrical system. For example, in an uninterruptible power supply, batteries and a power inverter supply AC power when a main power supply is unavailable. Similarly, electric motors may utilize power inverters to produce a variable output voltage range as is often used within motor speed controllers. Regardless of the purpose, power inverters typically include a capacitor on the DC link. However, electrical connections between the capacitor and other inverter components can introduce inductance into the power inverter, negatively affecting the performance of the power converter. Reducing the inductance introduced by the connection or configuration of the DC link capacitor in the power inverter may improve the efficiency and operation of the power inverter.

SUMMARY

Disclosed herein are implementations of a power inverter circuit. In one implementation, a power inverter circuit includes a capacitor and a power module. The capacitor includes a positive plate and a negative plate that are spaced apart along opposing sides of the capacitor and extend toward each other along a common side of the capacitor. The power module includes a positive connector and a negative connector that are connected to the positive plate and the negative plate, respectively, and are spaced apart and extend parallel across from each other.

The positive plate and the negative plate may be spaced apart over a substantial majority of a height of the capacitor and may be bent toward each other along the common side. Ends of the positive plate and the negative plate may form a positive terminal and a negative terminal, respectively. The positive terminal and the negative terminal may be substantially planar, may extend substantially parallel across from each other in different planes, may extend in a direction of elongation of the capacitor, may be separated by a dielectric material, and/or may form a blade that extends away from the common side for connection to the power module.

The power module may include a circuit board that may be parallel with the common side of the capacitor and may include a connection system. The connection system may include the positive connector and the negative connector, which may be substantially planar, may extend away from the circuit board toward the capacitor, may extend substantially parallel across from each other in different planes in the direction of elongation of the capacitor, and/or may be spaced apart to receive and compress therebetween the blade to connect the positive connector to the positive plate and the negative connector to the negative plate.

The power module may include a positive substrate having a positive inner copper layer and a positive ceramic layer. The positive inner copper layer may extend beyond the positive ceramic layer to form the positive connector as a positive flange. The positive flange may be coupled to the positive plate substantially continuously and/or over a majority of a length of the power module. The power module may also include a negative substrate having a negative inner copper layer and a negative ceramic layer. The negative inner copper layer may extend beyond the negative ceramic layer to form the negative connector as a negative flange. The negative flange may be coupled to the negative plate substantially continuously and/or over a majority of the length of the power module. The positive flange and the negative flange may extend from a common edge of the power module. The positive substrate and the negative substrate may face each other. The power module may further include a flexible circuit board and/or circuit components that may be arranged in apertures of the flexible circuit board. The flexible circuit board and the circuit components may be arranged between and may electrically insulate the positive substrate and the negative substrate.

A power module for an inverter circuit includes a first substrate, a second substrate, a circuit board, and circuit components. The first substrate is a copper-ceramic substrate having a first outer copper layer, a first inner copper layer, and a first ceramic layer arranged between the first outer copper layer and the first inner copper layer. The first inner copper layer extends past the first ceramic layer to form a first extension for coupling to a first plate of a capacitor. The second substrate is another copper-ceramic substrate having a second outer copper layer, a second inner copper layer, and a second ceramic layer arranged between the second outer copper layer and the second inner copper layer. The second inner copper layer extends past the second ceramic layer to form a second extension for coupling to a second plate of the capacitor. The second inner copper layer faces and extends substantially parallel with the first inner copper layer of the first substrate. The circuit board is positioned between the first copper layer and the second copper layer. The circuit components are positioned between the first inner copper layer and the second inner copper layer.

The first inner copper layer and the second inner copper layer may extend from a common side of the power module to form the first extension and the second extension, respectively. The circuit components may be arranged in apertures of the circuit board which may be larger than the circuit components. The circuit board and the circuit components may electrically insulate the first inner copper layer from the second inner copper layer. Insulating material may further insulate the first inner copper layer and the second inner copper layer in gaps between the circuit board and the circuit components formed by the apertures.

A power converter includes a capacitor and at least three power modules. Each power module includes a positive board and a negative board that are electrically coupled to the capacitor along a majority of a length of the power module. Each positive board may have a positive inner layer that extends from the positive board and is coupled to the capacitor. Each negative board may have a negative inner layer that extends from the negative board and is coupled to the capacitor. The positive inner layers and the negative inner layers of the at least three power modules be electrically coupled to the capacitor cooperatively over a majority of a length of the capacitor.

In each power module, the positive board may face the negative board. The positive inner layer may be parallel with the negative inner layer and may be electrically insulated therefrom by a circuit board. The positive inner layer and the negative inner layer may extend away from the positive board and the negative board, respectively, away from each other.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

Figure

Figure

DETAILED DESCRIPTION

Aspects of the present disclosure involve a power inverter or other-type of high power circuit. Generally speaking, a power inverter includes a capacitor and one or more power modules that are connected to reduce inductance. More particularly, in various embodiments, the capacitor is connected to the one or more power modules with positive and negative connectors that extend parallel with each other along at least a portion of a length of the capacitor and/or the power module in interrupted or continuous fashions, which may reduce inductance and increase operating efficiency as compared to other power inverters.

In one example, a power inverter utilizes one or more connection systems configured as spring contact connection systems, which connect a capacitor (e.g., DC link capacitor) with a power module. The capacitor includes blade terminals that are received by the connection systems of the power module. The connection systems generally include a positive connector and a negative connector that are arranged across from each other and that connect near the switching devices or components of the inverter module. By utilizing the blade terminals of the capacitor for the spring contact connection system located near the switching devices of the inverter, the inductance within the power inverter circuit is reduced compared to other capacitor connection systems, thereby increasing the operating efficiency of the power inverter. The power inverter may include multiple connection systems which may be arranged along a length of the power module, for example, with the positive connector and the negative connector of each connection system being positioned in close proximity across from each other and the multiple connection systems being separated (e.g., interrupted) by circuit components therebetween.

In another example, a power inverter includes a capacitor having positive and negative lead frames that extend parallel with and across from each other along a length of the capacitor, and one or more power modules having positive and negative connectors that extend in parallel with each other along a length of the power module. The positive and negative connectors of the power modules are electrically coupled to the positive and negative lead frames substantially continuously along the length of the power module, which may reduce inductance as compared to other inverters.

Figure 1:
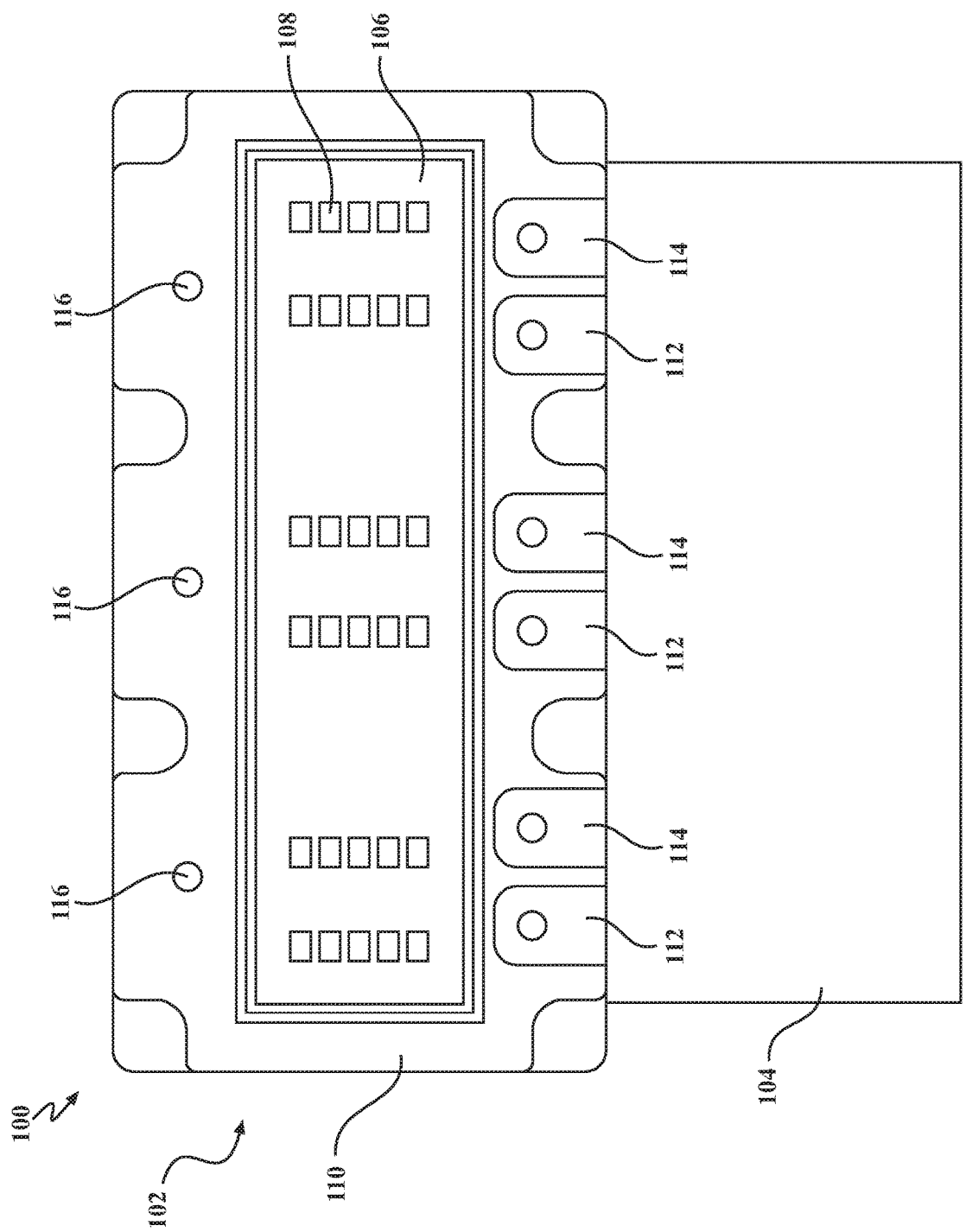
FIG. 1 is a diagram illustrating an overhead view of a first embodiment of a power inverter circuit.

FIG. 1 is a diagram illustrating an overhead view of a first embodiment of a power inverter circuit 100. The power inverter circuit 100 may also be referred to as a power converter, power inverter, or such circuit, device, or system. The power inverter circuit 100 includes a power module 102 (e.g., power converter or inverter module) and a capacitor 104 (e.g., a DC link capacitor). The power inverter circuit 100 converts direct current (DC) to alternating current (AC) for use by an electrical system. The power module 102 includes a circuit board 106 (e.g., power module circuit board) on which several circuit components 108 (e.g., switching or electronic components, such as MOSFET components) may be interconnected. In one particular embodiment, the circuit components 108 include one or more switching components for use by the power inverter circuit 100, among other components. Those of skill in the art will understand the various circuit components and interconnections between the components that may be used in a high power inverter circuit. As such, the types of components used and connections between the components through the circuit board 106 are not described herein.

The power inverter circuit 100 illustrated in FIG. 1 is a three-phase power inverter. A housing 110 of the power inverter circuit 100 houses the circuit board 106 and includes several connectors 112-116 (e.g., connections or terminals) for connecting to the three-phases of the power inverter circuit 100. In particular, the power inverter circuit 100 includes three positive connectors 112 (e.g., positive DC input connectors), three negative connectors 114 (e.g., negative DC input connectors), and three phase output connectors 116. More or fewer connectors 112-116 may be included in the housing 110 of the power inverter circuit 100 depending on the configuration of the power inverter circuit 100. For example, a single phase inverter circuit may include one positive connector 112, one negative connector 114, and one phase output connector 116. Through the connectors 112-116, a DC input is provided to the power inverter circuit 100 and an AC output is received. In some embodiments, the connectors 112-116 may be bolted joint connectors, pressed terminal connectors, or soldered pin connectors.

Many high power inverter circuits utilize the capacitor 104 at the input of the DC signal. Thus, the capacitor 104 typically connects to the circuit components 108 of the power inverter circuit 100 through the DC input connectors 112-114. For example, the capacitor 104 of FIG. 1 may include three capacitors that each connect to the power module 102 through one of the positive connectors 112 and one of the negative connectors 114. In this embodiment, a conducting component may connect an output of the capacitor 104 to the positive connectors 112 of the power module 102 through a bolted joint connector such that the power module 102 and the capacitor 104 are side-by-side when connected. However, the side-by-side connection of the capacitor 104 to the power module 102 may negatively affect the performance of the power inverter circuit 100 for several reasons. For example, the positive connectors 112 and the negative connectors 114, by being provided by the housing 110, are located far from the circuit components 108 of the power inverter circuit 100. The transmission of the DC input from the capacitor 104 to the circuit components 108 introduces an inductance into the circuit which may negatively affect the inverter performance. In addition, the distance between the lead frame terminals of the capacitor 104 connecting the capacitor to the power module 102 introduces an inductance loop that also may negatively affect the performance of the power inverter circuit 100. For example, as shown in FIG. 1, the positive connector 112 and the negative connector 114 (and corresponding lead frame terminals of the capacitor 104) may be substantially planar and spaced apart in a common plane to be side-by-side (e.g., the positive connectors 112 and the negative connectors 114 of the three sets shown are arranged in alternating fashion). Thus, a connection system that minimizes or reduces the distance between the connection of the capacitor 104 to the power module 102 and the circuit components 108 of the circuit may improve the performance of the power inverter circuit 100. Additionally, reducing the space between the lead frame terminals of the capacitor 104 and/or between the positive connector 112 and negative connector 114 may further reduce the inductance introduced through the capacitor 104 connection.

As shown in FIGS. 2A-2E, another embodiment of a power inverter circuit 200 has low inductance (e.g., reduced or lower inductance) as compared to the power inverter circuit 100. The power inverter circuit 200 includes a capacitor 203 and a power module 202 (e.g., power converter or inverter module) that are provided in cooperative configurations that introduce relatively low inductance. More particularly, reduced inductance may be provided by connections between the capacitor 203 and the power module 202 being in close proximity to the circuit components 108 of the power module 202 and/or close proximity of positive and negative connectors of the capacitor 203 and/or the power modules 202. These configurations may be provided by connection systems 204 of the power module 202 and capacitor blades 224 of the capacitor 203, which are received by the connection systems 204.

Figure 2A:
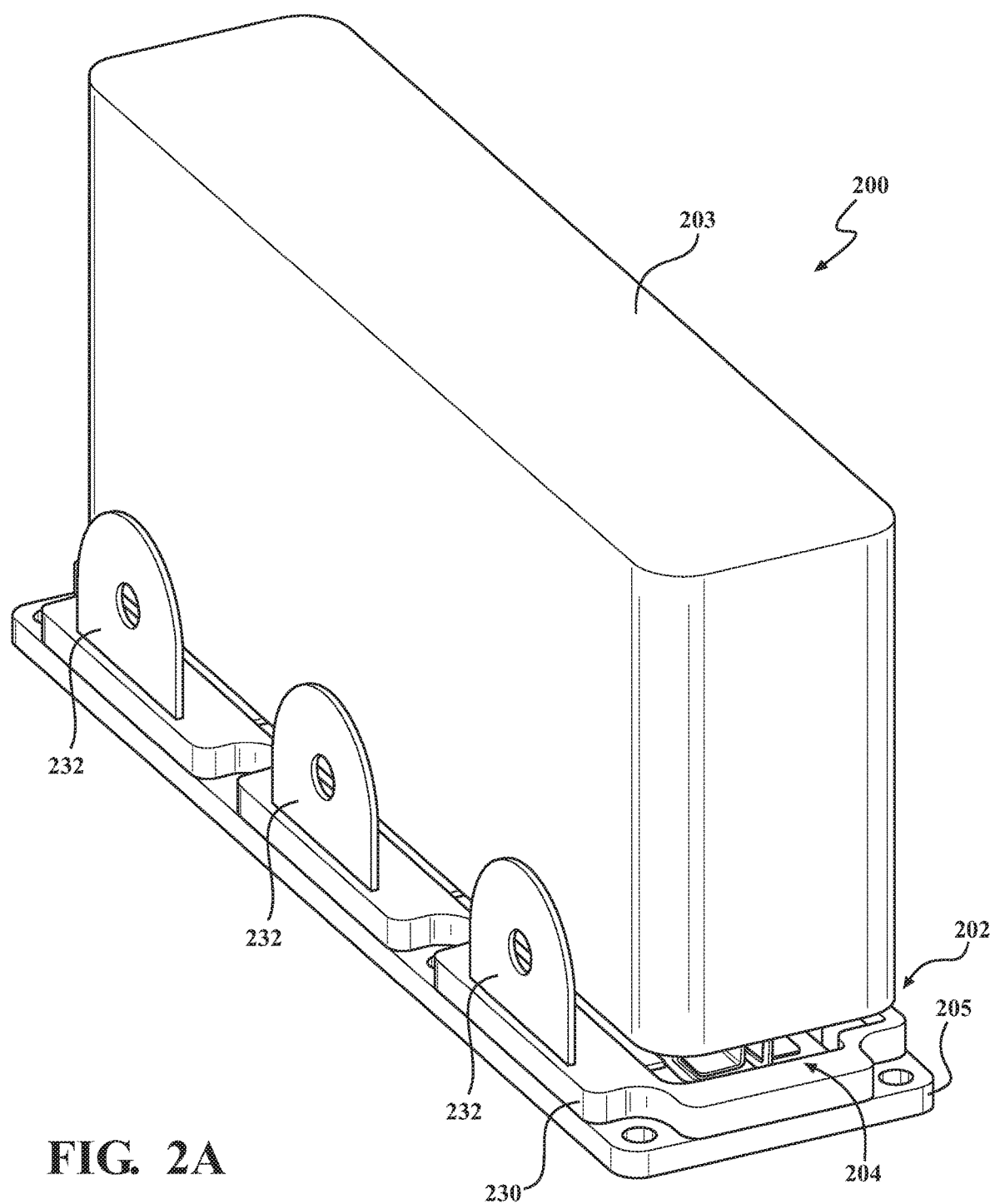
FIG. 2A is a diagram illustrating an upper perspective view of another embodiment of a power inverter circuit.
Figure 2B:
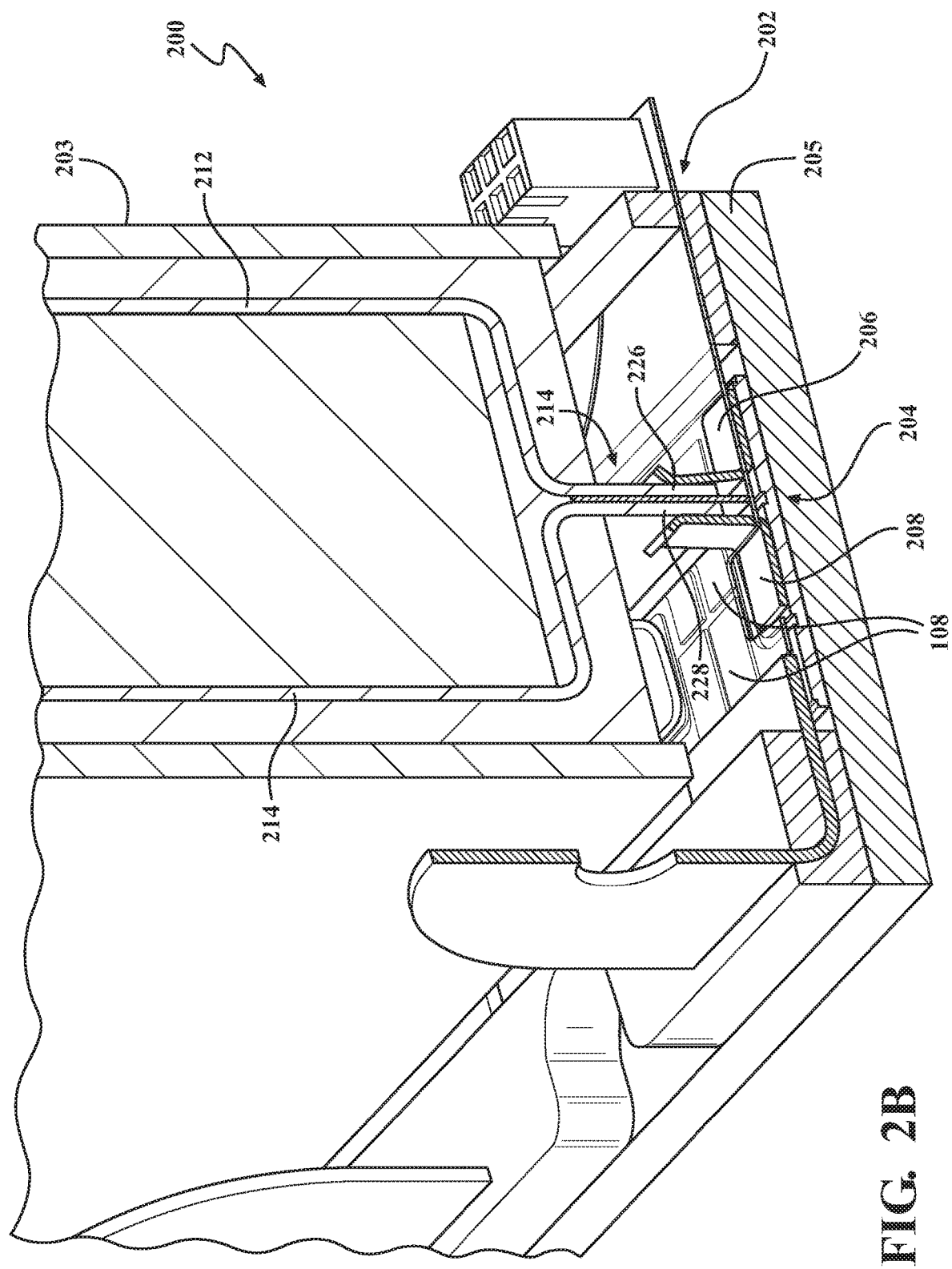
FIG. 2B is a partial cross-sectional view of the power inverter circuit of FIG. 2A.
Figure 2C:
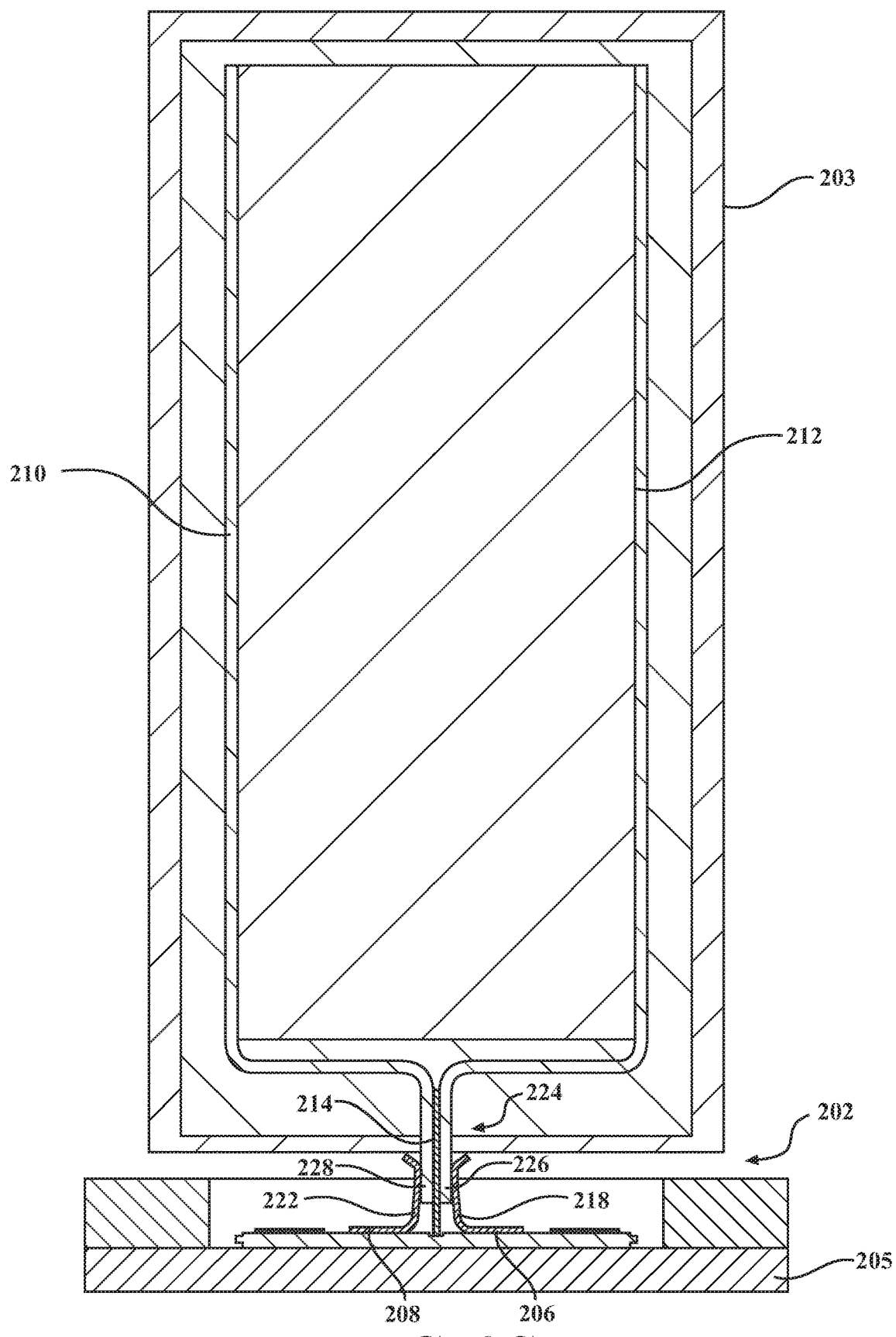
FIG. 2C is a cross-sectional view of the power inverter circuit of FIG. 2A.

As shown in FIG. 2A-2C, the power inverter circuit 200 includes three phase outputs 232, similar to the embodiment discussed above with reference to FIG. 1. The capacitor 203 is mounted on top of a circuit board 205 of the power module 202 and is connected thereto with a plurality of connection systems 204 (described in further detail below). The capacitor 203 is elongated in a direction of elongation, for example, having a length extending rearward as shown in FIG. 2A and that is greater than a width thereof. The capacitor 203 may be configured as a capacitor unit having more than one capacitor. In one particular embodiment, the capacitor 203 may be attached to a housing 230 around the circuit board 205 of the power module 202 to provide stability to the power inverter circuit 200. For example, the capacitor 203 may be bolted to the housing 230 through a series of bolted joints. However, the capacitor 203 may be attached to the housing 230 in any manner or may not be attached to the housing at all. While the power inverter circuit 200 may be configured as a three-phase power inverter or in any other desired manner with any suitable number of connection systems 204.

In general, the connection systems 204 allow the capacitor 203 to connect to the circuit components 108 (such as switching devices) of the power module 202 and, more particularly, allow the capacitor 203 to be nearer to the circuit components 108 as compared to the power inverter circuit 100. By connecting the capacitor 203 in close proximity to (e.g., near) the circuit components 108, the inductance due to the transmission of the DC signal through the connection system 204 is reduced compared with the connection system illustrated in FIG. 1. Further, the connection systems 204 allow a positive terminal 226 and a negative terminal 228 (e.g., first and second lead frame terminals or leads) of the capacitor 203 to be nearer each other (e.g., in close proximity to each other, such as by being separated by a thin dielectric 214) to minimize the inductance loop caused by the positive terminal 226 and the negative terminal 228. In these manners, inductance may be reduced to increase the performance and efficiency of the power inverter circuit 200 as compared to the power inverter circuit 100.

Figure 2D:
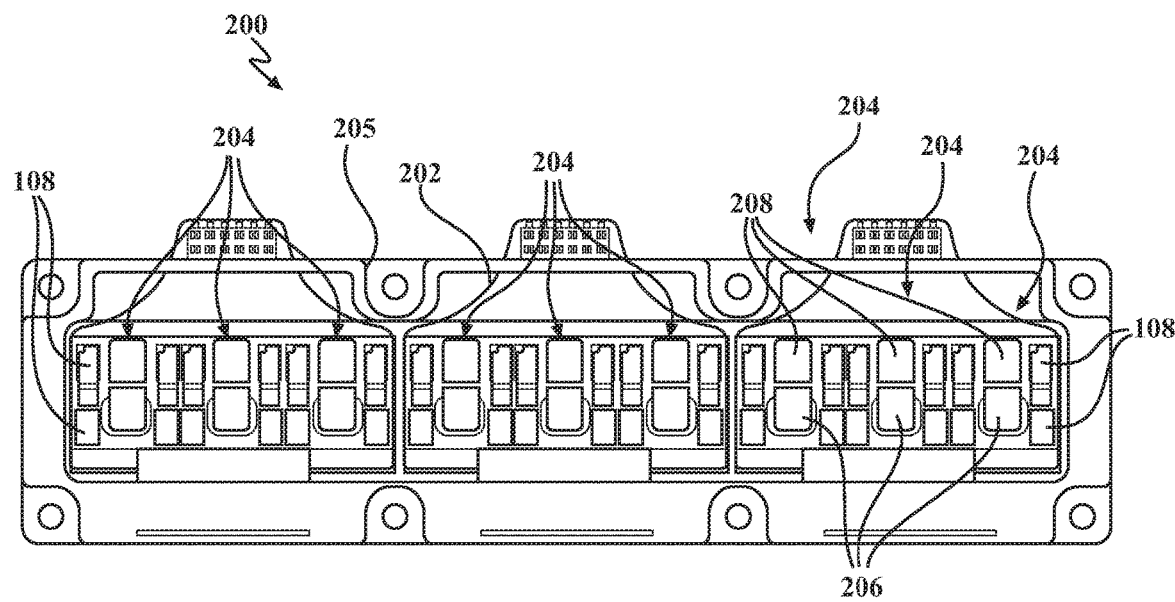
FIG. 2D is an overhead view of a power module of the power inverter circuit of FIG. 2A.

Referring to FIGS. 2B-2E, the power module 202 includes a circuit board 205 (e.g. power module circuit board). As shown in FIGS. 2B and 2D, the circuit board 205 includes the circuit components 108 of the power inverter circuit 100 as described above and one or more of the connection systems 204. However, rather than including connections to the capacitor 104 on the housing 110 of the power inverter circuit 100 as described above, the connection systems 204 are located on the circuit board 205 nearer to the circuit components 108. Although FIG. 2D depicts nine of the connection systems 204 on the circuit board 205, it should be appreciated that the power inverter circuit 200 may include any number of the connection systems 204. For example, as shown in FIG. 3, another power module 302 includes a circuit board 305 having two of the connection systems 204 thereon.

Referring to FIGS. 2B to 2E, each of the connection systems 204 includes a positive connector 206 and a negative connector 208 (e.g., first and second connectors) disposed on the circuit board 205. The positive connector 206 and the negative connector 208 are positioned adjacent and/or between corresponding or associated ones of the circuit components 108. As a result, the circuit components 108 may be positioned between the connection systems 204 along a length of the capacitor 203 and/or the power module 202 (e.g., so as to interrupt or form interrupted connections between the capacitor 203 and the power module 202). The positive connector 206 includes a base portion 216 (e.g., positive base portion) mounted on the circuit board 205 and a positive terminal 218 (e.g., first or positive terminal portion) extending away from the circuit board 205. Similarly, the negative connector 208 includes a base portion 220 (e.g., negative base portion) mounted on the circuit board 205 and a negative terminal 222 (e.g., second or negative terminal portion) extending away from the circuit board 205.

In one embodiment, the positive connector 206 and the negative connector 208 are in electrical communication with a portion of the circuit board 205 while being electrically isolated from each other to prevent shorts within the power inverter circuit 200 (e.g., by being spaced apart from each other).

As shown, the positive terminal 218 and the negative terminal 222 are substantially planar and are spaced apart from each other in separate planes. The positive terminals 218 of multiple connection systems 204 may be arranged in one plane that is spaced apart from the negative terminals 222 of the multiple connection systems in another plane.

In addition, the positive terminal 218 of the positive connector 206 and the negative terminal 222 of the negative connector 208 may be biased towards each other to provide a spring or pinching mechanism when a capacitor blade 224 of the capacitor 203 is placed between the positive terminal 218 and the negative terminal 222. In one embodiment, a space is present between the positive terminal 218 of the positive connector 206 and the negative terminal 222 of the negative connector 208 that is less than the width of the capacitor blade 224 (discussed in further detail below) when the capacitor 203 is not inserted into the connection systems 204 (e.g., the space being between the planes of the positive terminal 218 and the negative terminal 222). Further in some embodiments, ends of the positive terminal 218 and the negative terminal 222 of the positive connector 206 and the negative connector 208 opposite (e.g., distal from) the circuit board 205 may be flared away from each other (e.g., the opposite connector) for easy insertion of the capacitor blade 224 into the connection system 204.

By locating the connection system 204 on the circuit board 205, so as to be nearer the circuit components 108 of the power module 202, the distance between the connection system 204 and the circuit components 108 is reduced in comparison with the power inverter circuit 100 described above with reference to FIG. 1, which has the positive connector 112 and the negative connector 114 are provided by the housing 110. As such, inductance introduced into the system through the transmission of the DC signal through the connection system 204 is reduced by connecting the capacitor 203 directly onto the circuit board 205 near the circuit components 108 of the circuit board 205. Further, as explained in more detail below, the distance between the positive terminal 226 and the negative terminal 228 of the capacitor 203 is lessened which further reduces the inductance loop caused by the positive terminal 218 and the negative terminal 222 (e.g., lead frame terminals) through the connection system 204.

Figure 2E:
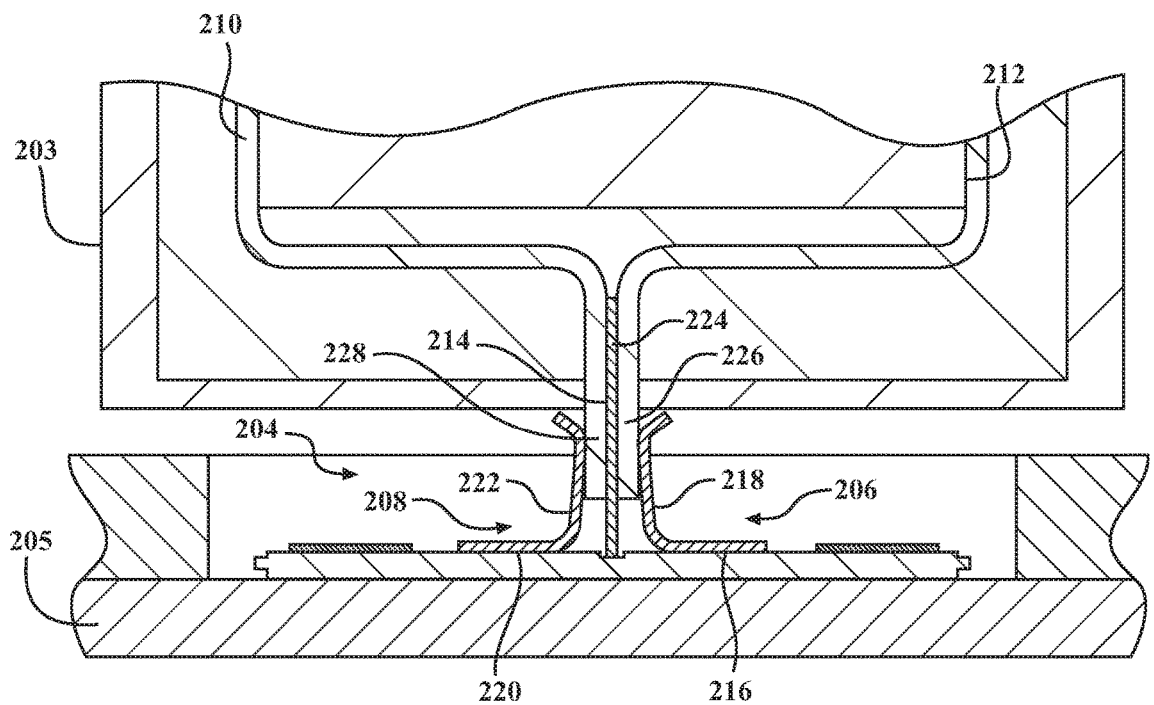
FIG. 2E is a detail cross-sectional view of the power inverter circuit of FIG. 2A as indicated in FIG. 2C.
Figure 3:
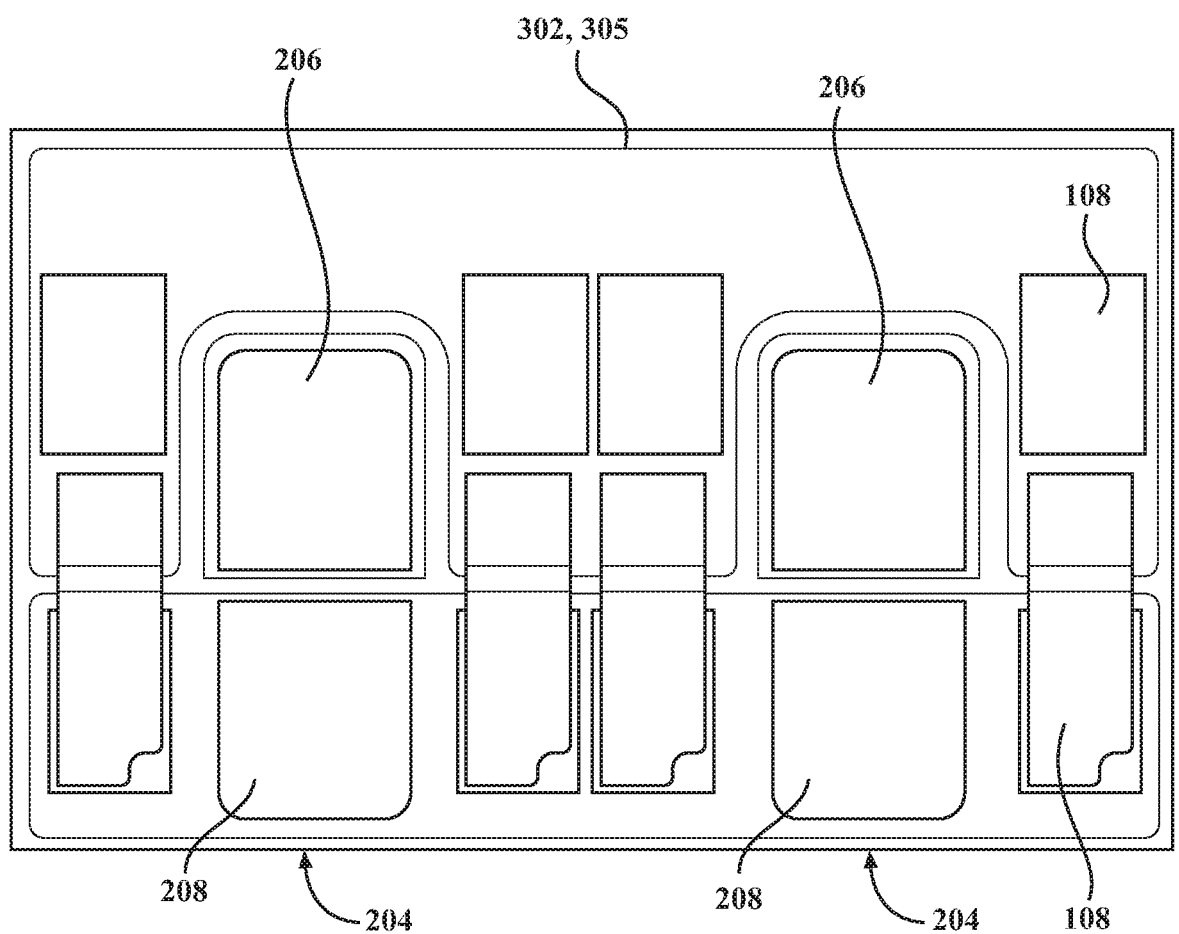
FIG. 3 is an overhead view of a power module for use in a variation of the power inverter circuit of FIG. 2A.

Referring to FIGS. 2B, 2C, and 2E, the capacitor 203 may be plugged directly into the connection system 204 on the circuit board 205. The capacitor 203 may include any number of capacitor blades 224 that extend from a housing of the capacitor 203. In one embodiment, the capacitor 203 may include the same number of capacitor blades 224 as the connection systems 204 disposed on the circuit board 205 of the power module 202.

Each capacitor blade 224 of the capacitor 203 is configured to connect to one of the connection systems 204, for example, by being received by (e.g., being inserted into) the connection system 204 between the positive terminal 218 and the negative terminal 222 of the positive connector 206 and the negative connector 208, respectively. The capacitor blade 224 may include the positive terminal 226 and the negative terminal 228 of the capacitor 203, which are separated by the thin dielectric 214 that is disposed between the positive terminal 226 and the negative terminal 228 to prevent shorting thereacross.

The positive connector 206 and the negative connector 208 of the connection system 204 are configured (e.g., biased) to compress (e.g., pinch) and hold the capacitor blade 224 in place when inserted. Thus, the connection system 204 may be described as a spring or sprung connection system. The width of the capacitor blade 224 may be such as to fit between and connect to (e.g., contact) the positive terminal 218 and the negative terminal 222 of the connection system 204 on the circuit board 205. The connection between the capacitor blade 224 and the connection system 204 provides electrical communication between the positive terminal 226 of the capacitor blade 224 and the positive terminal 218 of the positive connector 206 of the power module 202, and between the negative terminal 228 of the capacitor blade 224 and the negative terminal 222 of the negative connector 208 of the power module 202. Thus, through the connection system 204 and the capacitor blade 224, the capacitor 203 is in electrical communication with the power module 202. To connect the capacitor 203 to the power module 202, an assembler of the power inverter circuit 200 presses the capacitor 203 to insert the capacitor blades 224 of the capacitor 203 between the positive connector 206 (e.g., the positive terminal 218 thereof) and the negative connector 208 (e.g., the negative terminal 222 thereof) of the connection system 204 of the power module 202.

Referring to FIGS. 2A to 2C and 2E, the capacitor 203 is shown as plugged into (e.g., connected to or received by) the circuit board 205 of the power module 202. The capacitor 203 includes a negative plate 210 (e.g., first plate) and a positive plate 212 (e.g., second plate). Those of skill in the art will recognize the various types and configurations of capacitors that may be utilized with power inverter circuits such that the details of the capacitor 203 are not described herein. The negative terminal 228 of the capacitor blade 224 is formed from (e.g., continuously with) the negative plate 210 of the capacitor 203 as shown. Similarly, the positive terminal 226 of the capacitor blade 224 is formed from the positive plate 212 of the capacitor 203. As shown in cross-section, the negative plate 210 and the positive plate 212 are spaced apart a relatively large distance and may be substantially planar over a substantial majority of the capacitor 203 (e.g., a height or body of the capacitor 203). The negative plate 210 and the positive plate 212 then bend toward each other at or along a common side of the capacitor 203. The negative plate 210 and the positive plate 212 then bend outward and extend through the outer housing of the capacitor 203 away from the common side of the capacitor 203 to form the negative terminal 228 and the positive terminal 226. The negative terminal 228 and the positive terminal 226 are substantially planar members that are spaced apart in separate (e.g., substantially parallel) planes but in close proximity to each other (e.g., being separated by the thin dielectric 214). The negative terminal 228 and the positive terminal 226, thereby, form the capacitor blade 224 to be inserted into the connection system 204 to form the electrical communication between the capacitor 203 and the power module 202. The negative terminals 228 of multiple capacitor blades 224 of the capacitor 203 may be arranged in one plane and be spaced apart (e.g., by the thin dielectric 214 of each capacitor blade 224) from the positive terminals 226 of the multiple capacitor blades 224 arranged in another plane.

Further, as mentioned above, the positive terminal 226 of the capacitor blade 224 and the negative terminal 228 of the capacitor blade 224 are separated by a thin dielectric 214 (e.g., dielectric material). In general, any known or hereafter developed dielectric material may be utilized to separate the terminals of the capacitor blade 224. In addition to reducing the inherent inductance introduced into the power inverter system by locating the connection between the capacitor 203 and the circuit near the circuit components 108 of the power module 202, as compared to the configuration of the power inverter circuit 100, the power inverter circuit 200 of the second embodiment also reduces the inductance loop effect of the system through the connectors (i.e., the positive terminal 226 and the negative terminal 228) of the capacitor 203. In the embodiment illustrated in FIG. 1 and discussed above, the leads from the capacitor 104 to the power module 102 are spaced apart in a side-by-side manner to connect to the positive connectors 112 and the negative connectors 114 of the power module 102. By locating the capacitor leads in this side-by-side configuration, a large inductance loop is created that introduces inductance into the power inverter circuit 100 that negatively affects the performance of the power inverter. Conversely, the embodiment illustrated in FIGS. 2A-3 utilizes the capacitor blade 224 to connect the capacitor 203 to the power module 202. In this embodiment, the distance between the positive terminal 226 and the negative terminal 228 of the capacitor blade 224 is kept close together to minimize or reduce the inductance loop introduced into the power inverter circuit 200. This further reduction of inductance in allows the power inverter circuit 200 to perform more efficiently than the power inverter circuit 100 of the first embodiment.

In one particular embodiment, the distance between the connection system 204 and the nearest one of the circuit components 108 on the circuit board 205 is approximately 1 millimeter, although any distance is contemplated. The base portion 216 of the positive connector 206 of the connection system 204 and the base portion 220 of the negative connector 208 of the connection system may include an area of approximately 5 millimeters by 5 millimeters. Further, the positive terminal 218 of the positive connector 206 of the connection system 204 and the negative terminal 222 of the negative connector 208 of the connection system may extend approximately 5 millimeters from the circuit board 205 surface. In general, however, the dimensions of the components of the connection system 204 may be any size as desired by a designer of the power inverter circuit 200. In addition, although the connection system 204 is described above as a spring contact connection system, the connection system between the capacitor 203 and the power module 202 may be any type of connection (e.g., physical connection), including bolted joints, pressed terminals, soldered pins, and the like. Thus, other embodiments are contemplated in which the positive terminal 226 and the negative terminal 228, or extensions thereof, extend toward each other and/or are otherwise in close proximity to each other.

In addition to reducing the inductance introduced into the power inverter circuit 200, the connection system 204 may also aid in reducing the overall size of the power inverter circuit 200 as compared to the power inverter circuit 100. For example, comparing FIG. 1 to FIG. 2D, by connecting the capacitor 203 above the power module 202 in the power inverter circuit 200, the size of the power inverter circuit 200 may be reduced compared to the embodiment where the capacitor 104 and power module 102 are side-by-side. More particularly, because the positive terminal 226 and the negative terminal 228 of each capacitor blade 224 are spaced across from each other in different planes (not side-by-side in a common plane as shown in FIG. 1 for the power inverter circuit 100), more connections between the capacitor 104 and the circuit board 106 may be utilized in the power inverter circuit 200 (e.g., along a length of the capacitor 203) to further increase the performance of the power inverter circuit 200 as compared to the power inverter circuit 100.

In the power inverter circuit 200 and variations thereof, the circuit board 205 may include one or more flex circuit layers. In general, flex circuits include mounting the circuit components 108 on flexible, plastic substrates. Such flexible substrates include polyimide or transparent conductive polyester films, among other materials. The flexible circuit configuration allows the circuit board 205 to conform to a desired shape or to flex during use. Utilizing flex circuit technology may reduce the potential damage to the circuit board 205 during connection of the capacitor 203 to the circuit board 205. In particular, the circuit board 205 may flex when the capacitor blade 224 is inserted in the connection system 204 on the board, preventing damage to the circuit board 205. Further, through the use of the flex circuit, gate drive components of the power inverter circuit 200 may be located closer to switch components of the power module 202 to improve the efficiency and performance of the power inverter circuit 200.

Figure 4A:
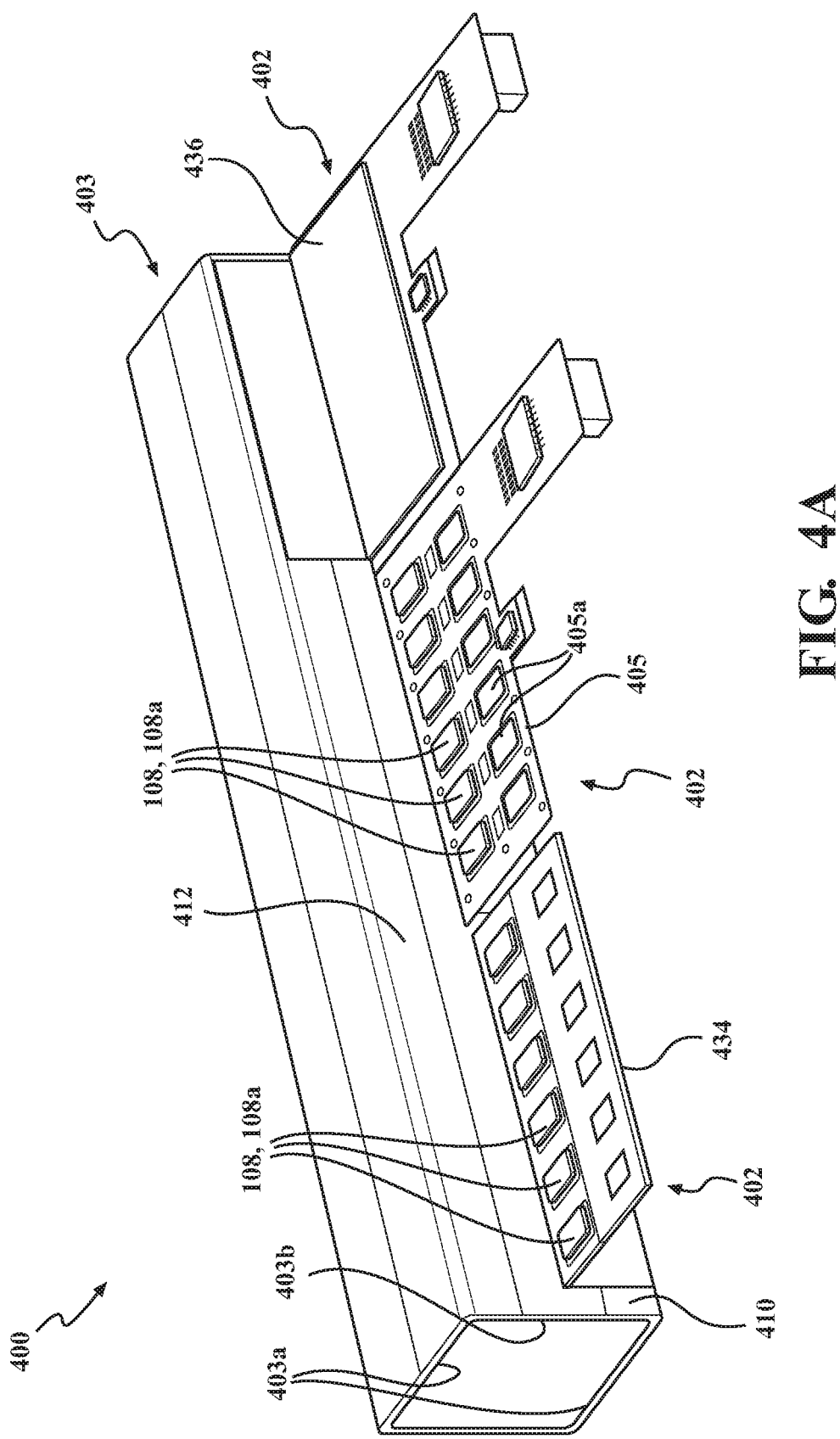
FIG. 4A is a perspective view of another embodiment of a power inverter circuit having three power modules in successive states of assembly.
Figure 4B:
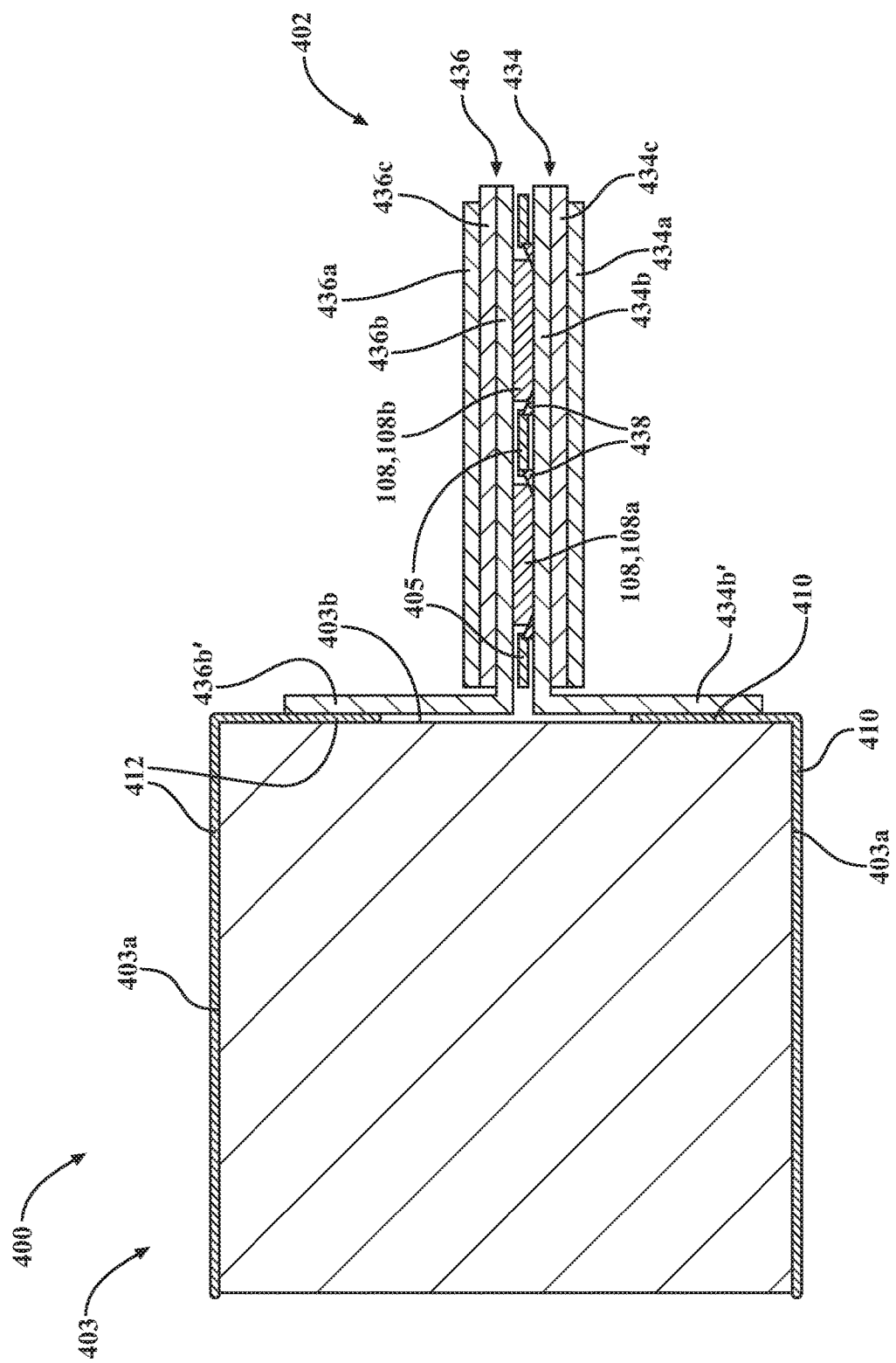
FIG. 4B is a cross-sectional view of the power inverter circuit shown in FIG. 4A.

Referring to FIGS. 4A and 4B, a third embodiment of a power inverter circuit 400 is shown. The power inverter circuit 400 includes one or more power modules 402 and a capacitor 403.

The capacitor 403 is elongated, for example, along a length and having a substantially constant cross-sectional shape (e.g., being rectilinear with four sides). The length, for example, may be greater than any outer or side dimension of the cross-sectional shape. The capacitor 403 may be configured as a capacitor unit having more than one capacitor.

The capacitor 403 includes a negative plate 410 (e.g., first or negative plate, lead, or lead frame) and a positive plate 412 (e.g., second or positive plate, lead, or lead frame). In cross-section, the negative plate 410 and the positive plate 412 extend around adjacent corners of the capacitor 403 toward each other. For example, the negative plate 410 and the positive plate 412 extend along opposite sides 403*a* of the capacitor 403, and bend around the adjacent corners to extend toward each other along a common side 403*b* of the capacitor 403. The negative plate 410 and the positive plate 412 are also elongated along a substantial portion (e.g., majority, near entirety, such as 90% or more, or therebetween) of the length of the capacitor 403.

The power inverter circuit 400, for example, includes three power modules 402, which may be configured to provide three-phase AC electrical power in manners known in the art. As shown in FIG. 4A, the three power modules 402 are shown in successive states of assembly. The power modules 402 are configured to each connect to the capacitor 403 along the lengths thereof and/or cooperatively along the length of the capacitor 403, which may reduce inductance (e.g., as compared to the side-by-side arrangement of the positive connector 112 and the negative connector 114 of the power inverter circuit 100). Furthermore, the power modules 402 include positive and negative components that are planar and in close proximity to each other, which may also reduce inductance compared to the power inverter circuit 100 in a similar manner to the planar, spaced-apart relationship of the negative terminal 228 and the positive terminal 226 of the capacitor blade 224 of the power inverter circuit 200.

Each of the power modules 402 is substantially planar and extends substantially perpendicularly from a middle region of the common side 403*b* of the capacitor 403 and along a portion of the length of the capacitor 403 (e.g., being parallel with the opposite sides 403a of the capacitor 403). Each of the power modules 402 includes a negative substrate 434 (e.g., first or negative board; best shown in the power module 402 in the left-most position in FIG. 4A), a positive substrate 436 (e.g., second or positive board; seen in the power module 402 in the right-most position in FIG. 4A), and a flexible circuit board 405 (best shown in the power module 402 in the middle position in FIG. 4A). The power module 402 also includes a plurality of circuit components 108 (e.g., switches or MOSFET devices), which are configured in manners known in the art for providing a desired power output (see further description of the circuit components 108 above). The negative substrate 434 and the positive substrate 436 face each other with the flexible circuit board 405 and the circuit components 108 arranged therebetween (e.g., forming a layered arrangement or sandwich-type structure).

The negative substrate 434 and the positive substrate 436 are each a copper-ceramic substrate (e.g., directed bonded copper or DBC substrate). The negative substrate 434 generally includes an outer copper layer 434a (e.g., first outer copper layer or conductive layer), an inner copper layer 434b (e.g., first inner copper layer, negative inner copper layer, or first or negative inner layer), and a ceramic layer 434c (e.g., first or negative ceramic layer) arranged between outer copper layer 434a and the inner copper layer 434b. In the power module 402, the inner copper layer 434b is positioned adjacent the flexible circuit board 405.

The outer copper layer 434a is, for example, substantially continuous on an outer surface of the ceramic layer 434c.

The inner copper layer 434b is provided on an inner surface of the ceramic layer 434c. The inner copper layer 434b may provide separate conductive paths (e.g., power conducting paths, lines, or traces) to and/or from each of the circuit components 108 (e.g., connecting to the negative plate 410 of the capacitor 403 and/or for connecting to external electrical systems). A first group 108a (e.g., first or inner row) of the circuit components 108 (e.g., a first or inner row) is attached to the negative substrate 434, such that each one of the circuit components 108 is electrically coupled to associated ones of the conductive paths of the inner copper layer 434b.

The inner copper layer 434b additionally extends from the ceramic layer 434c to be physically and electrically coupled to the negative plate 410 (e.g., forming a first or negative terminal of the power module 402). More particularly, the inner copper layer 434b protrudes past an edge of the ceramic layer 434c toward the common side 403b of the capacitor 403, and extends substantially continuously along a length of the ceramic layer 434c (e.g., parallel with the elongation of the capacitor 403). The inner copper layer 434b is bent around an edge of the ceramic layer 434c, so as to form a negative flange 434b' (e.g., connector or extension) that extends along the common side 403b of the capacitor 403 toward the negative plate 410, so as to engage (e.g., overlap) and be physically and electrically coupled to the positive plate 412 in a substantially continuous manner (e.g., via laser welding).

The positive substrate 436 is configured substantially similar to the negative substrate 434 with like elements being referred to with like suffixes (e.g., an outer copper layer 436a of the positive substrate 436 is configured similar to the outer copper layer 434a of the negative substrate 434). The positive substrate 436 is a copper-ceramic substrate that includes the outer copper layer 436a (e.g., second outer copper layer), an inner copper layer 436b (e.g., positive inner copper layer, second inner copper layer, or second or positive inner layer), and a ceramic layer 436c (e.g., positive ceramic layer, or second ceramic layer) arranged therebetween. The inner copper layer 436b faces and extends parallel with the inner copper layer 434b of the negative substrate 434. The inner copper layer 436b also forms separate conductive paths associated with and in electrical contact with a second group 108b (e.g., second or outer row) of the circuit components 108 that is attached to the positive substrate 436. It should be noted that the second group 108b of circuit components 108 are not shown depicted in FIG. 4A as they are hidden by the positive substrate 436, but would be positioned in the outer row of apertures 405a of the flexible circuit board 405. Electrical connections between the conductive paths and the circuit components 108 may be provided in any suitable manner. For further details of the positive substrate 436 and its various features or components, refer to the discussion of the negative substrate 434 above.

The inner copper layer 436b additionally protrudes from the ceramic layer 436c to form a positive flange 436b' (e.g., connector or extension) that extends along the common side 403b of the capacitor 403, and is physically and electrically coupled to the positive plate 412 in the manner described above for the negative flange 434b'. As a result, the negative flange 434b' and the positive flange 436b' may extend parallel with each other in a direction of elongation of the capacitor 403. As an additional result, both the negative flange 434b' and the positive flange 436b' may be coupled to the negative plate 410 and the positive plate 412, respectively, over a significant portion (e.g., majority, near entirety, such as 90% or more, or therebetween) of a length of the power module 402. Furthermore, multiple power modules 402 may, thereby, be coupled to the negative plate 410 and the positive plate 412 of the capacitor 403 over a significant portion (e.g., majority, near entirety, such as 90% or more, or therebetween) of a length of the capacitor 403. The resultant electrical couplings or connections (e.g., contact area) may also be substantially continuous between the negative flange 434b' of the power module 402 and the negative plate 410 of the capacitor 403 and between positive flange 436b' of the power module 402 and the positive plate 412 of the capacitor 403. This substantial continuity and/or significant length of the electrical connection of the power modules 402 and the capacitor 403 reduce inductance as compared to the interrupted and relatively short contact area formed by the positive connectors 112 and the negative connectors 114 of the power inverter circuit 100 discussed above.

Furthermore, by having at least one combination of the negative plate 410 and the positive plate 412, the negative flange 434b' and the positive flange 436b', or both extend along the common side 403b of the capacitor 403 toward each other, inductance may be reduced. For example, this arrangement allows the negative substrate 434 and the positive substrate 436 to face and be in close proximity with each other. As a result, the inner copper layer 434b of the negative substrate 434 and the inner copper layer 436b of the positive substrate 436 extend in parallel and in close proximity with each other (e.g., forming substantially planar positive and negative components that are spaced apart in different planes but in close proximity to each other). This close proximity of the inner copper layer 434b of the negative substrate 434 and the inner copper layer 436b of the positive substrate 436 (e.g., being spaced apart by a thickness of the circuit components 108 therebetween) reduces inductance as compared to a further distance therebetween.

This is similar to the manner in which the positive terminal 218 and the negative terminal 222 of the capacitor blade 224 of the power inverter circuit 200 are arranged across from each other in close proximity to create low inductance.

As referenced above, the flexible circuit board 405 (e.g., flex circuit) is arranged between the negative substrate 434 and the positive substrate 436. The flexible circuit board 405 provides conductive paths (not shown or labeled) to the circuit components 108 for sending control signals to control operation thereof (e.g., gate, switching, or control lines, traces, or paths). Electrical connections between the conductive paths of the flexible circuit board 405 and the circuit components 108 may be formed in any suitable manner. As referenced above, the power conducting paths to/from the circuit components 108 (e.g., to/from the capacitor 203 and/or for connecting to external electrical systems) may be provided by the inner copper layer 434b and/or the inner copper layer 436b of the negative substrate 434 and the positive substrate 436, respectively.

The flexible circuit board 405 is a substantially continuous substrate (e.g., plastic, such as polyimide), which includes apertures 405a (e.g., windows) in each of which is received one of the circuit components 108. In the resultant structure, the flexible circuit board 405 and the circuit components 108 are substantially coplanar (e.g., a single plane passes through the flexible circuit board 405 and each of the circuit components 108) and are arranged between the negative substrate 434 and the positive substrate 436.

Each of the apertures 405a of the flexible circuit board 405 are sized so as to receive the associated circuit components 108 therein during assembly processes. For example, the flexible circuit board 405 may be placed on the negative substrate 434, after which the circuit components 108 are positioned in the apertures 405a, and finally the positive substrate 436 is positioned on the flexible circuit board 405. For the circuit components 108 to be reliably received in the apertures 405a during the assembly operations, the apertures 405a are oversized as compared to the circuit components 108 (e.g., being, for example, 1 mm larger in each dimension). As a result, an air gap (i.e., from an edge of the circuit component 108 to an edge of the aperture 405a) is formed between the inner copper layer 434b of the negative substrate 434 and the inner copper layer 436b of the positive substrate 436.

The inner copper layer 434b of the negative substrate 434 and the inner copper layer 436b of the positive substrate 436, while being in close proximity to each other and having a high voltage potential therebetween, are electrically isolated from each other by the flexible circuit board 405 and the circuit components 108. In regions of the air gaps (i.e., in the apertures 405a between material of the flexible circuit board 405 and the circuit components 108), insulating material 438 is provided to complete the electrical isolation in the air gaps that might otherwise extend from the inner copper layer 434b of the negative substrate 434 to the inner the inner copper layer 436b of the positive substrate 436. Stated differently, the flexible circuit board 405, the circuit components 108, and the insulating material 438 cooperatively electrically isolate or insulate the inner copper layer 434b of the negative substrate 434 from the inner copper layer 436b of the positive substrate 436. The insulating material 438, for example, extends from the material of the flexible circuit board 405 to the circuit component 108 around a periphery thereof. Portions of the insulating material 438 may extend below the flexible circuit board 405 and/or the circuit component 108 (e.g., being between the inner copper layer 434b or the inner copper layer 436b and one or both of the flexible circuit board 405 and the circuit component 108). The insulating material 438 may, or may not, completely fill the air gap and/or extend from both the inner copper layer 434b and the inner copper layer 436b of the negative substrate 434 and the positive substrate 436, respectively.

In one example, the insulating material 438 is an underfill material (e.g., a polymer, as is known in the art), which is applied as a liquid material (e.g., with an injection-type device) and subsequently cured. In another example, the insulating material is an insulator preform, which is provided as a solid polymer material, positioned relative to the flexible circuit board 405 and the circuit components 108 (e.g., with a pick and place machine), and processed to flow and cure into position (e.g., by heating and cooling). In a still further example, the insulating material 438 may be a coating (e.g., parylene) provided on the inner copper layer 434b of the negative substrate 434 and/or the inner copper layer 436b of the positive substrate 436. The coating is not present in regions required for conductive contact (e.g., with the circuit components 108), for example, by masking appropriate regions when the coating is applied or subsequently removing the coating in appropriate regions.

Figure 5:
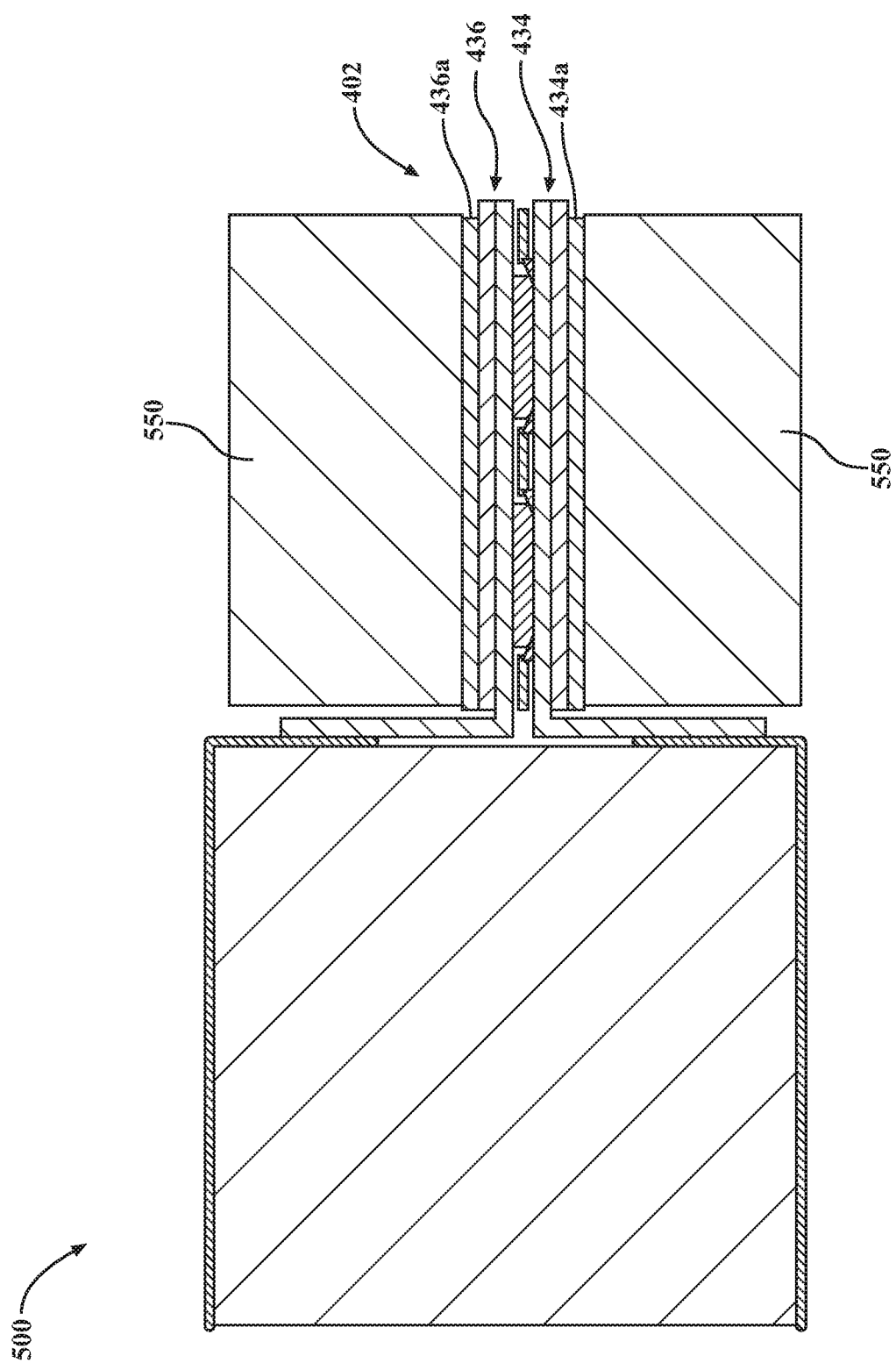
FIG. 5 is a cross-sectional view of another embodiment of a power inverter circuit.

Referring to FIG. 5, another embodiment of a power inverter circuit 500 is configured substantially similar to the power inverter circuit 400 but additionally includes one or more coolers 550. The one or more coolers 550 are positioned adjacent the power module 402. More particularly, the one or more coolers 550 are positioned adjacent and/or in contact with the negative substrate 434 (e.g., the outer copper layer 434a thereof) and/or the positive substrate 436 (e.g., the outer copper layer 436a thereof). The cooler 550 (e.g., cooling device) may be any suitable type of cooler for use with the power inverter circuit 500.

Figure 6:
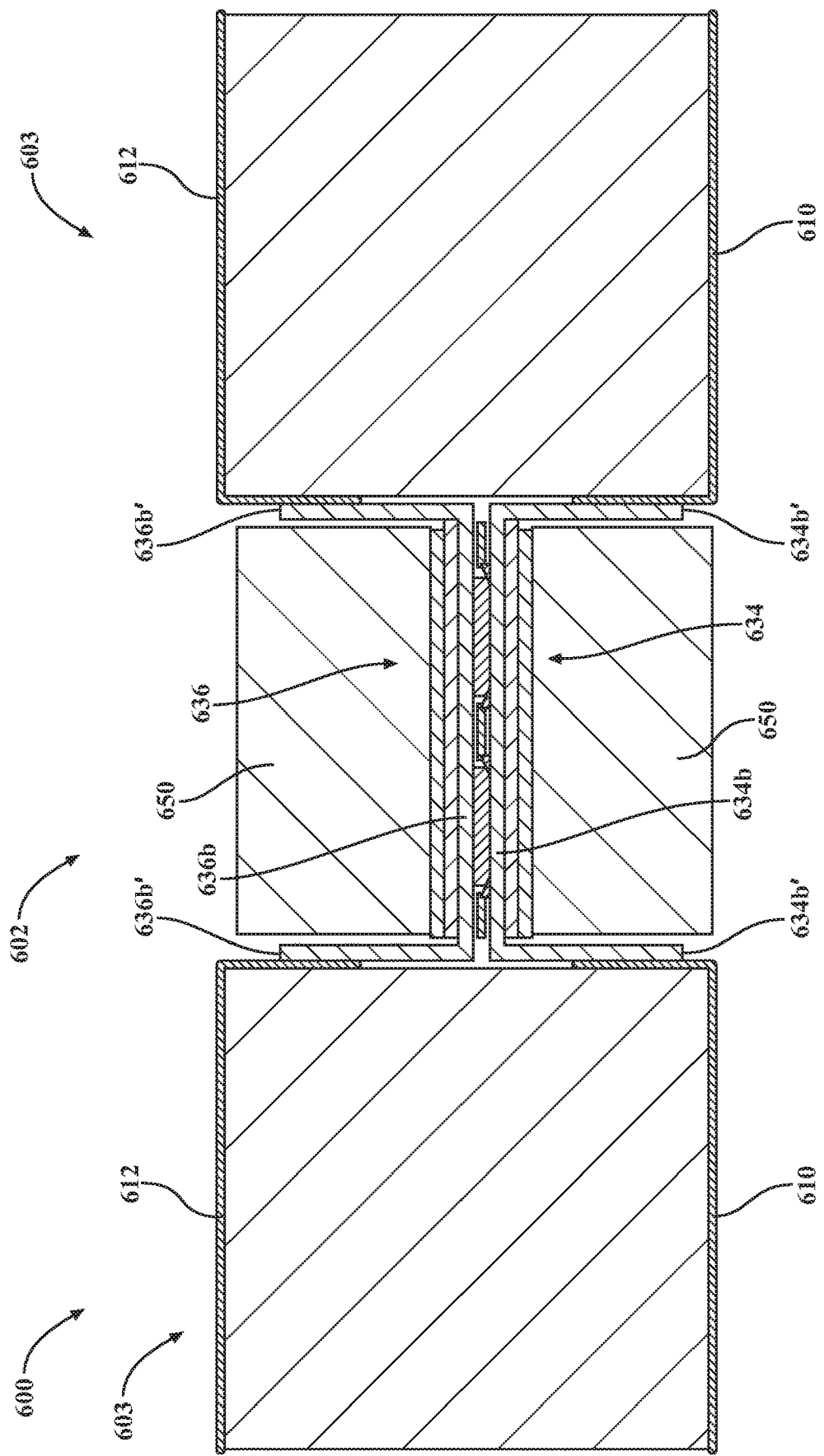
FIG. 6 is a cross-sectional view of another embodiment of a power inverter circuit.

Referring to FIG. 6, another embodiment of a power inverter circuit 600 is configured substantially similar to the power inverter circuit 400 or the power inverter circuit 500, but includes capacitors 603 arranged on each edge of a power module 602. The power module 602 is arranged relative to the capacitors 603 on each edge thereof in a substantially similar manner to which the power module 402 is arranged relative to the capacitor 403 of the power inverter circuit 400 (e.g., by extending substantially perpendicular from and along a common side or edge thereof). The power module 602 is configured substantially similar to the power module 402 but instead includes negative flanges 634b' (e.g., coupled to or continuously formed with an inner copper layer 634b) that extend from both edge of a negative substrate 634 for coupling to negative plates 610 of the capacitors 603 on each edge thereof. Similarly, the power module 602 includes positive flanges 636b' (e.g., coupled to or continuously formed with an inner copper layer 636b) that extend from both edges of the positive substrate 636 for coupling to the positive plates 612 of the capacitors 603 on each edge thereof. For further details of the power module 602, including the substrates and circuit board thereof, refer to discussion of the power module 402 above.

Figure 7:
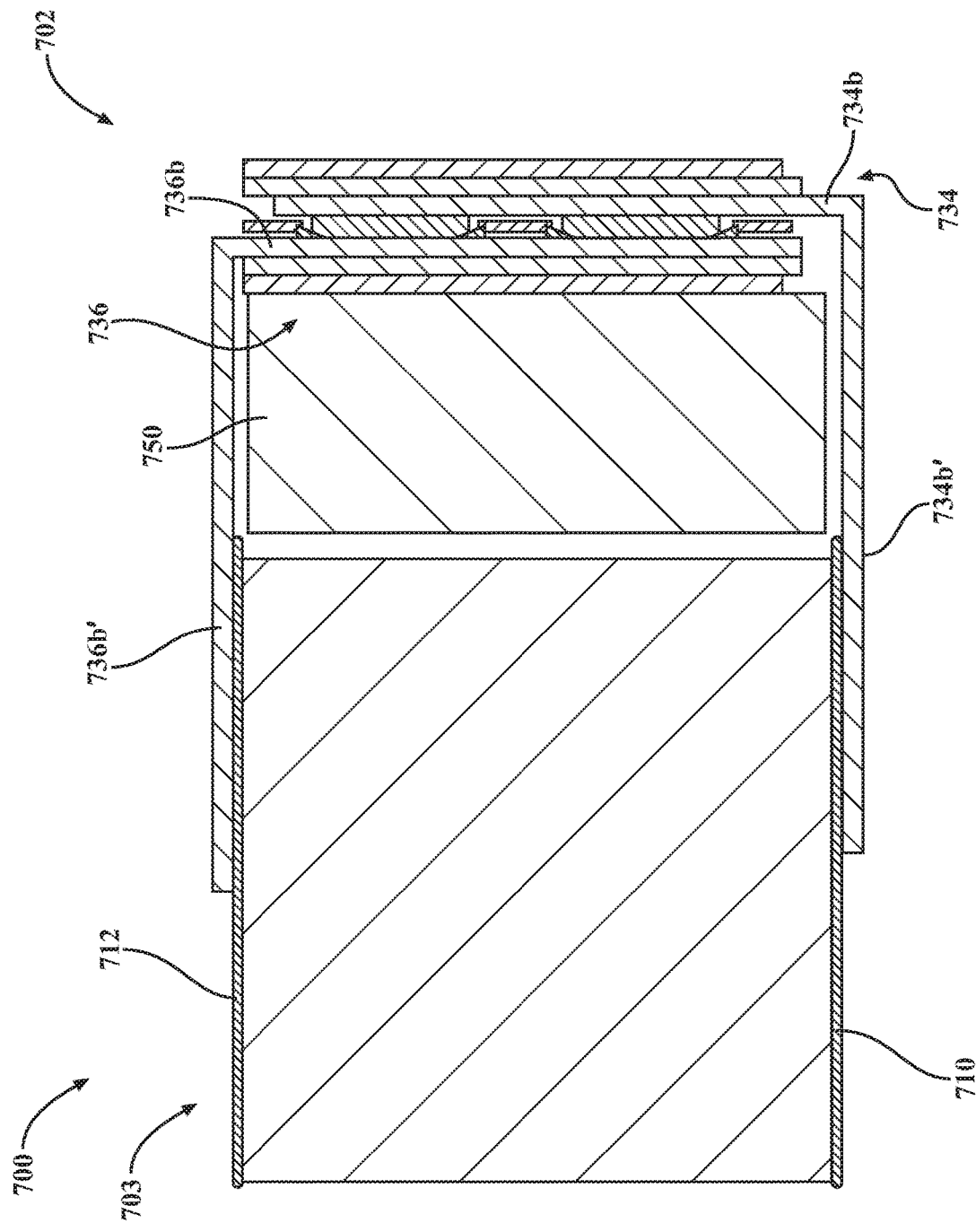
FIG. 7 is a cross-sectional view of another embodiment of a power inverter circuit.

Referring to FIG. 7, another embodiment of a power inverter circuit 700 includes a power module 702 and a capacitor 703. The power module 702 is configured substantially similar to the power module 402, for example, by having a negative substrate 734 and a positive substrate 736. However, the inner copper layer 734a of the negative substrate 734 and the inner copper layer 736a of the positive substrate 736 extend from opposite edge of the power module 702 (as opposed to a common edge, thereof, as with the power module 402). Furthermore, the power module 702 is arranged substantially parallel with and spaced apart from the capacitor 703, as opposed to being substantially perpendicular to and in close proximity to the capacitor 403 as is the power module 402. For further details of the power module 702, refer to discussion of the power module 402 above.

The inner copper layer 734b of the negative substrate 734 extends from the negative substrate 734 to form a negative flange 734b' (e.g., extension) that is coupled to a negative plate 710 of the capacitor 703 (e.g., with laser welding). Similarly, the inner copper layer 736b of the positive substrate 736 extends from the positive substrate 736 to form a positive flange 736b' (e.g., extension) that is coupled to a positive plate 712 of the capacitor 703 (e.g., with laser welding). The negative flange 734b' and the positive flange 736b' of the power module 702 are spaced apart from each other (e.g., by the width of the power module 702 and/or the capacitor 703) and the power module 702 is spaced apart from the capacitor 703, so as to form a void therebetween. A cooler 750 is arranged within this void (e.g., between the negative flange 734b', the positive flange 736b', the power module 702, and the capacitor 703) and in close proximity and/or in physical contact with the power module 702 (e.g., the negative substrate 734 or the positive substrate 736) and/or the capacitor 703 to provide cooling thereto. For further details of the power module 702, including the negative substrate 734, the positive substrate 736, and a circuit board 738, refer to discussion of the power module 402 above.

Low inductance for the power inverter circuit 700 is achieved, for example, by having each power module 702 be connected to the capacitor 703 over a significant (e.g., nearly entire) length of the power module 702 and/or having the power modules 702 be cooperatively connected to the capacitor 703 over a significant (e.g., nearly entire) length of the capacitor 703.

Figure 8:
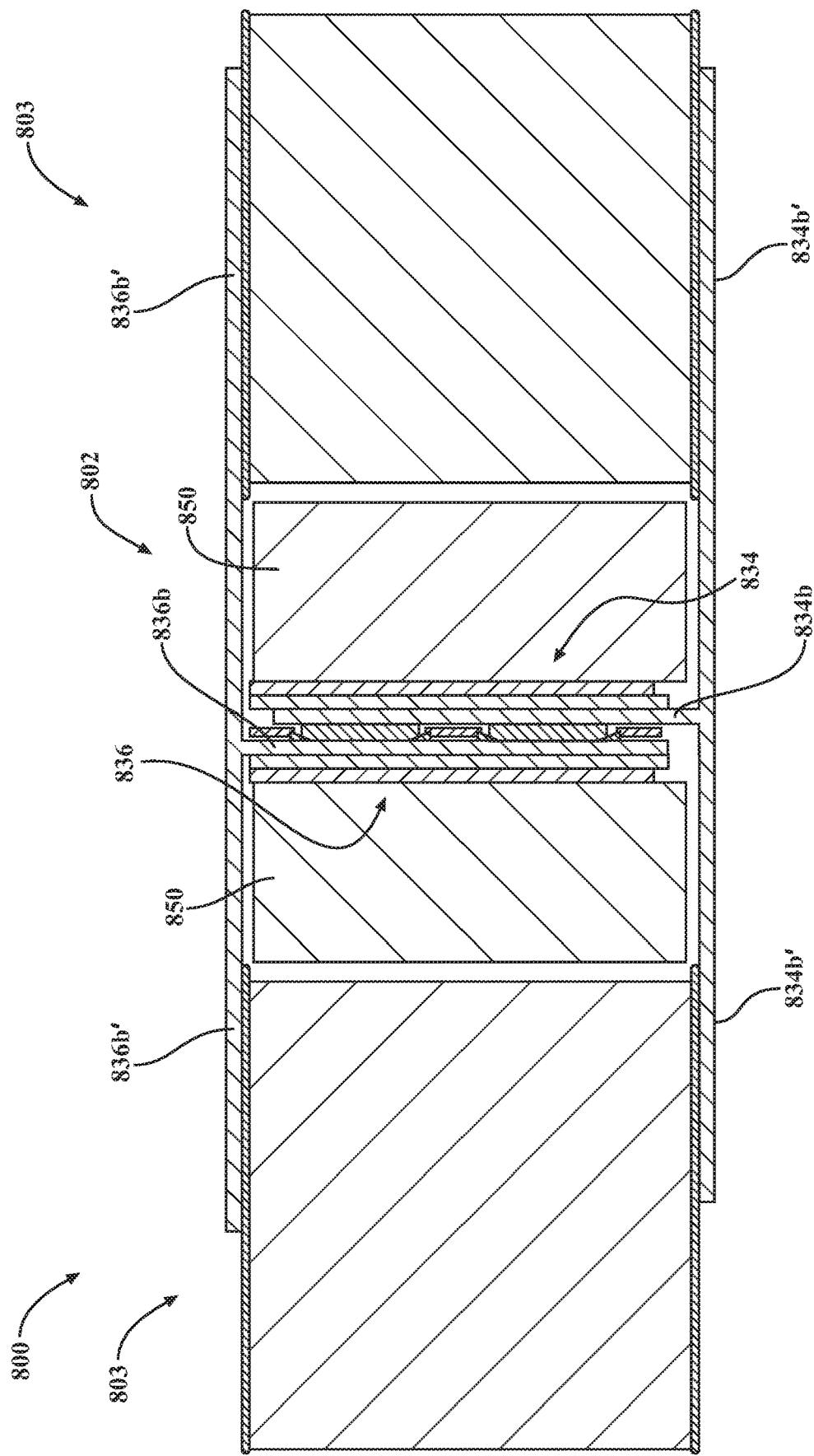
FIG. 8 is a cross-sectional view of another embodiment of a power inverter circuit.

Referring to FIG. 8, another embodiment of a power inverter circuit 800 is configured substantially similar to the power inverter circuit 800 but includes capacitors 803 arranged on each side of a power module 802. The power module 802 is arranged relative to the capacitors 803 on each side thereof in a substantially similar manner to which the power module 702 is arranged relative to the capacitor 403 (e.g., by extending substantially parallel with and spaced apart from the capacitors 803). The power module 802 is configured substantially similar to the power module 702 but instead includes two negative flanges 834b' (e.g., coupled to or formed continuously with an inner copper layer 834b of a negative substrate 834) that extend from a common edge of the power module 802, and two positive flanges 836b' (e.g., coupled to or formed continuously with an inner copper layer 836b of a positive substrate 836) that extend from an opposite edge of the power module 802. Coolers 850 are arranged between the capacitors 803 and the power module 802 on each side thereof. For further details of the power module 802, refer above to the discussions of the power module 402 and the power module 702.

All directional references (e.g., proximal, distal, upper, lower, upward, downward, left, right, lateral, front, back, top, bottom, above, below, vertical, horizontal, clockwise, and counterclockwise) are only used for identification purposes to aid the reader's understanding of the presently disclosed technology and do not create limitations, particularly as to the position, orientation, or use of the presently disclosed technology. Furthermore, paired terms or identifiers, such as positive and negative, first and second, and/or other (or another) may be substituted for each other.

While the present disclosure has been described with reference to various implementations, it will be understood that these implementations are illustrative and that the scope of the disclosure is not limited to them. Many variations, modifications, additions, and improvements are possible. More generally, implementations in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A power inverter circuit comprising:
   a capacitor having a positive plate and a negative plate that are spaced apart along opposing sides of the capacitor and extend toward each other along a common side of the capacitor;
   a power module comprising a positive connector and a negative connector that are connected to the positive plate and the negative plate respectively, wherein the positive connector and the negative connector are spaced apart and extend parallel across each other;
   wherein the module further includes a circuit board between and extending parallel with the positive connector and the negative connector.

2. The power inverter circuit according to claim 1, wherein the positive plate and the negative plate are spaced apart over a substantial majority of a height of the capacitor and are bent toward each other along the common side.

3. The power inverter circuit according to claim 1, wherein the power module includes *-the circuit board having a connection system, wherein the connection system includes the positive connector and the negative connector that are substantially planar, that are spaced apart, and that extend away from the circuit board toward the capacitor.

4. The power inverter circuit according to claim 3, wherein the positive connector and the negative connector extend substantially parallel across from each other in different planes in a direction of elongation of the capacitor.

5. The power inverter circuit according to claim 3, wherein the power module incudes another connection system having another positive connector and another negative connector that are substantially planar, that are spaced apart, and that extend away from the circuit board, wherein the positive connector and the other positive connector are arranged in a plane, and the negative connector and the other negative connector are arranged in another plane that is spaced apart from the plane.

6. The power inverter circuit to claim 1, wherein the power module includes a positive substrate having a positive inner copper layer and a positive ceramic layer, the positive inner copper layer extending beyond the positive ceramic layer to form the positive connector as a positive flange that is coupled substantially continuously to the positive plate over a majority of a length of the power module; and
   wherein the power module includes a negative substrate having a negative inner copper layer and a negative ceramic layer, the negative inner copper layer extending beyond the negative ceramic layer to form the negative connector as a negative flange that is coupled substantially continuously to the negative plate over a majority of the length of the power module, wherein the positive flange and the negative flange extend from a common edge of the power module;

wherein the positive substrate and the negative substrate face each other, and the power module further includes the circuit board and circuit components arranged in apertures of the flexible circuit board, the circuit board and the circuit components being arranged between and electrically insulating the positive substrate and the negative substrate.

7. A power inverter circuit comprising:
a capacitor having a positive plate and a negative plate that are spaced apart along opposing sides of the capacitor and extend toward each other along a common side of the capacitor;
a power module comprising a positive connector and a negative connector that are connected to the positive plate and the negative plate respectively, wherein the positive connector and the negative connector are spaced apart and extend parallel across each other;
wherein the power module includes a positive substrate having a positive inner copper layer and a positive ceramic layer, the positive inner copper layer extending beyond the positive ceramic layer to form the positive connector as a positive flange that extends along the common side and is coupled to the positive plate over a majority of a length of the power module; and
wherein the power module includes a negative substrate having a negative inner copper layer and a negative ceramic layer, the negative inner copper layer extending beyond the negative ceramic layer to form the negative connector as a negative flange that extends along the common side is coupled to the negative plate over a majority of the length of the power module.

8. The power inverter circuit according to claim 7, wherein the positive flange is coupled substantially continuously to the positive plate, and the negative flange is coupled substantially continuously to the negative plate.

9. The power inverter circuit to claim 7, wherein the positive flange and the negative flange extend from a common side of the power module.

10. The power inverter circuit to claim 7, wherein the positive substrate and the negative substrate face each other, and the power module further includes a flexible circuit board and circuit components arranged between the positive substrate and the negative substrate.

11. The power inverter circuit to claim 10, wherein the flexible circuit board and the circuit components electrically insulate the positive substrate from the negative substrate.

12. The power inverter circuit to claim 11, wherein the circuit components are arranged in apertures of the flexible circuit board, and insulating material spans gaps between the flexible circuit board and the circuit components to insulate the positive substrate from the negative substrate.

13. The power inverter circuit according to claim 10, wherein the positive inner copper layer and the negative inner copper layer conduct power between the capacitor and the circuit components, and the flexible circuit board communicates control signals to the circuit components.

14. The power inverter circuit to claim 7, wherein the power module extends substantially perpendicular to the common side of the capacitor.

15. The power inverter circuit according to claim 7, wherein the power module extends substantially parallel with the common side of the capacitor, and a cooler is arranged between the capacitor and the power module.

16. The power inverter circuit to claim 7, further comprising another capacitor connected to the power module, wherein the power module is positioned between the capacitor and the other capacitor.

17. A power module for an inverter circuit comprising:
a first substrate that is a copper-ceramic substrate having a first outer copper layer, a first inner copper layer, and a first ceramic layer arranged between the first outer copper layer and the first inner copper layer, wherein the first inner copper layer extends past the first ceramic layer to form a first extension for coupling to a first plate of a capacitor;
a second substrate that is another copper-ceramic substrate having a second outer copper layer, a second inner copper layer, and a second ceramic layer arranged between the second outer copper layer and the second inner copper layer, wherein the second inner copper layer extends past the second ceramic layer to form a second extension for coupling to a second plate of the capacitor, wherein the second inner copper layer faces and extends substantially parallel with the first inner copper layer of the first substrate;
a circuit board positioned between the first copper layer and the second copper layer; and circuit components positioned between the first inner copper layer and the second inner copper layer.

18. The power module according to claim 17, wherein the first inner copper layer and the second inner copper layer extend from a common side of the power module to form the first extension and the second extension, respectively; and
wherein the circuit components are arranged in apertures of the circuit board which are larger than the circuit components, the circuit board and the circuit components electrically insulate the first inner copper layer from the second inner copper layer, and insulating material further insulates the first inner copper layer and the second inner copper layer in gaps between the circuit board and the circuit components formed by the apertures.

19. The power module according to claim 17, wherein the first inner copper layer and the second inner copper layer extend from a common side of the power module to form the first extension and the second extension.

20. The power module according to claim 7, wherein the first inner copper layer and the second inner copper layer extended from another common side of the power module to form another first extension and another second extension for coupling to another first plate and another second plate of another capacitor.

21. The power module according to claim 17, wherein the circuit components are arranged in apertures of the circuit board.

22. The power module according to claim 21, wherein the circuit board and the circuit components electrically insulate the first inner copper layer from the second inner copper layer.

23. The power module according to claim 22, wherein the apertures are larger than the circuit components, and insulating material insulates the first inner copper layer from the second copper layer in gaps between the circuit board and the circuit components formed by the apertures.

24. A power converter comprising:
a capacitor that is elongated in a lengthwise direction; and
three power modules, wherein each power module has a length in a lengthwise direction and includes a positive board and a negative board;
wherein the positive board of each of the three power modules is electrically coupled to the capacitor in the lengthwise direction for a distance that is a majority of the length of the respective power module, and the negative board of each of the three power modules is electrically coupled to the capacitor in the lengthwise direction for a distance that is a majority of the length of the respective power module.

25. The power converter according to claim 24, wherein the positive boards and the negative boards of the three power modules are electrically coupled to the capacitor over a majority of a length of the capacitor.

26. The power converter according to claim 24, wherein the positive board includes a positive inner layer that extends from the positive board and is coupled to the capacitor, and includes a negative board having a negative inner layer that extends from the negative board and is coupled cooperatively to the capacitor.

27. A power converter comprising:
a capacitor; and
three power modules, wherein each power module includes a positive board and a negative board, wherein the positive board is electrically coupled to the capacitor along a majority of a length of the power module, and the negative board is electrically coupled to the capacitor along a majority of a length of the power module;
wherein the positive boards and the negative boards of the three power modules are electrically coupled to the capacitor over a majority of a length of the capacitor;
wherein the positive board includes a positive inner layer that extends from the positive board and is coupled to the capacitor, and includes a negative board having a negative inner layer that extends from the negative board and is coupled cooperatively to the capacitor; and
wherein in each power module, the positive board faces the negative board, and the positive inner layer is parallel with the negative inner layer and is electrically insulated therefrom by a circuit board, and the positive inner layer and the negative inner layer extend away from the positive board and the negative board, respectively, away from each other.

\* \* \* \* \*

UNITED STATES PATENT AND TRADEMARK OFFICE
CERTIFICATE OF CORRECTION

PATENT NO. : 10,601,335 B1
APPLICATION NO. : 15/406046
DATED : March 24, 2020
INVENTOR(S) : Javier Ruiz and Paul M. White Page 1 of 1

It is certified that error appears in the above-identified patent and that said Letters Patent is hereby corrected as shown below:

At Column 16, Claim number 3, Line number 34, "includes *-the circuit board" should be --includes the circuit board--.

At Column 16, Claim number 6, Line number 52, "circuit to claim 1" should be --circuit according to claim 1--.

At Column 17, Claim number 9, Line number 36, "circuit to claim 7" should be --circuit according to claim 7--.

At Column 17, Claim number 10, Line number 39, "circuit to claim 7" should be --circuit according to claim 7--.

At Column 17, Claim number 11, Line number 44, "circuit to claim 10" should be --circuit according to claim 10--.

At Column 17, Claim number 12, Line number 47, "circuit to claim 11" should be --circuit according to claim 11--.

At Column 17, Claim number 14, Line number 57, "circuit to claim 7" should be --circuit according to claim 7--.

At Column 17, Claim number 16, Line number 64, "circuit to claim 7" should be --circuit according to claim 7--.

At Column 18, Claim number 20, Line number 40, "according to claim 7" should be --according to claim 17--.

Signed and Sealed this
Twentieth Day of October, 2020

Andrei Iancu
*Director of the United States Patent and Trademark Office*